(12) United States Patent
Sheridan et al.

(10) Patent No.: US 11,776,994 B2
(45) Date of Patent: Oct. 3, 2023

(54) SIC MOSFET WITH REDUCED CHANNEL LENGTH AND HIGH $V_{th}$

(71) Applicant: Alpha and Omega Semiconductor International LP, Toronto (CA)

(72) Inventors: David Sheridan, Greensboro, NC (US); Arash Salemi, Cary, NC (US); Madhur Bobde, Sunnyvale, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 176 days.

(21) Appl. No.: 17/177,045

(22) Filed: Feb. 16, 2021

(65) Prior Publication Data

US 2022/0262896 A1 Aug. 18, 2022

(51) Int. Cl.
| | |
|---|---|
| *H01L 21/04* | (2006.01) |
| *H01L 29/06* | (2006.01) |
| *H01L 29/16* | (2006.01) |
| *H01L 29/66* | (2006.01) |
| *H01L 29/78* | (2006.01) |
| *H01L 29/10* | (2006.01) |

(52) U.S. Cl.
CPC ........ *H01L 29/063* (2013.01); *H01L 21/0465* (2013.01); *H01L 29/1095* (2013.01); *H01L 29/1608* (2013.01); *H01L 29/66068* (2013.01); *H01L 29/7802* (2013.01)

(58) Field of Classification Search
CPC ... H01L 29/04; H01L 29/0465; H01L 29/063; H01L 29/1033; H01L 29/1045; H01L 29/1095; H01L 29/1608; H01L 29/66068; H01L 29/66712; H01L 29/7802

USPC ........................................................ 257/77
See application file for complete search history.

(56) References Cited

U.S. PATENT DOCUMENTS

| | | | |
|---|---|---|---|
| 5,322,802 A | 6/1994 | Baliga et al. | |
| 6,091,107 A | 7/2000 | Amaratunga et al. | |
| (Continued) | | | |

FOREIGN PATENT DOCUMENTS

| | | | |
|---|---|---|---|
| CN | 104882447 | * | 9/2015 |
| JP | 2004335917 | * | 11/2004 |

OTHER PUBLICATIONS

Corporate Research & Development Group, Mitsubishi Electric Corporation, "Mitsubishi Electric Develops SiC Power Device with Record Power Efficiency", Public Relations Division, Mitsubishi Electric Corporation, Sep. 22, 2017.

(Continued)

*Primary Examiner* — Fazli Erdem
(74) *Attorney, Agent, or Firm* — JDI PATENT; Joshua D. Isenberg; Robert Pullman

(57) ABSTRACT

A silicon carbide MOSFET device and method for making thereof are disclosed. The silicon carbide MOSFET device comprises a substrate heavily doped with a first conductivity type and an epitaxial layer lightly doped with the first conductivity type. A body region of a second conductivity type opposite the first is formed in epitaxial layer and an accumulation mode region of the first conductivity type is formed in the body region and an inversion mode region of the second conductivity type formed in the body region. The accumulation mode region is located between the inversion mode region and a junction field effect transistor (JFET) region of the epitaxial layer.

15 Claims, 15 Drawing Sheets

(56) References Cited

U.S. PATENT DOCUMENTS

| | | | |
|---|---|---|---|
| 6,100,169 A | 8/2000 | Suvorov et al. |
| 6,509,233 B2 | 1/2003 | Chang et al. |
| 6,768,168 B1 | 7/2004 | Takahashi |
| 7,285,822 B2 | 10/2007 | Bhalla et al. |
| 7,381,992 B2 | 6/2008 | Ryu |
| 7,436,022 B2 | 10/2008 | Bhalla et al. |
| 7,521,332 B2 | 4/2009 | Li et al. |
| 7,605,425 B2 | 10/2009 | Bhalla et al. |
| 7,750,447 B2 | 7/2010 | Chang et al. |
| 7,767,526 B1 | 8/2010 | Lee et al. |
| 7,795,108 B2 | 9/2010 | Li et al. |
| 7,799,646 B2 | 9/2010 | Su et al. |
| 7,829,947 B2 | 11/2010 | Hébert |
| 7,851,856 B2 | 12/2010 | Hébert |
| 7,863,675 B2 | 1/2011 | Bhalla et al. |
| 7,867,852 B2 | 1/2011 | Hébert |
| 7,875,541 B2 | 1/2011 | Tai et al. |
| 7,879,676 B2 | 2/2011 | Lee et al. |
| 7,923,774 B2 | 4/2011 | Bhalla et al. |
| 7,936,011 B2 | 5/2011 | Bhalla et al. |
| 7,939,882 B2 | 5/2011 | Su et al. |
| 8,507,978 B2 | 8/2013 | Bhalla et al. |
| 9,048,282 B2 | 6/2015 | Hu et al. |
| 10,818,662 B2 | 10/2020 | Pala |
| 2004/0089910 A1 | 5/2004 | Hirler et al. |
| 2005/0280029 A1 | 12/2005 | Nakamura et al. |
| 2007/0114570 A1 | 5/2007 | Yamaguchi et al. |
| 2008/0246082 A1 | 10/2008 | Hshieh |
| 2008/0265289 A1 | 10/2008 | Bhalla et al. |
| 2008/0265312 A1 | 10/2008 | Bhalla et al. |
| 2009/0039386 A1 | 2/2009 | Ogura et al. |
| 2009/0039456 A1 | 2/2009 | Bhalla et al. |
| 2009/0114949 A1 | 5/2009 | Hebert |
| 2009/0127593 A1 | 5/2009 | Bhalla et al. |
| 2009/0181503 A1 | 7/2009 | Bhalla et al. |
| 2009/0242973 A1 | 10/2009 | Hebert et al. |
| 2009/0309156 A1 | 12/2009 | Darwish et al. |
| 2010/0148246 A1 | 6/2010 | Bhalla et al. |
| 2010/0155876 A1 | 6/2010 | Pan et al. |
| 2010/0225296 A1 | 9/2010 | Chang et al. |
| 2010/0258897 A1 | 10/2010 | Lui et al. |
| 2010/0314693 A1 | 12/2010 | Su et al. |
| 2010/0330767 A1 | 12/2010 | Lui et al. |
| 2011/0014766 A1 | 1/2011 | Hebert |
| 2011/0037120 A1 | 2/2011 | Chen et al. |
| 2011/0039383 A1 | 2/2011 | Chen et al. |
| 2011/0042724 A1 | 2/2011 | Bhalla et al. |
| 2011/0042727 A1 | 2/2011 | Pan et al. |
| 2011/0042742 A1 | 2/2011 | Bhalla et al. |
| 2011/0049564 A1 | 3/2011 | Guan et al. |
| 2011/0049618 A1 | 3/2011 | Lee et al. |
| 2011/0068386 A1 | 3/2011 | Tai et al. |
| 2011/0068395 A1 | 3/2011 | Hebert |
| 2011/0073906 A1 | 3/2011 | Bobde et al. |
| 2011/0073943 A1 | 3/2011 | Hebert |
| 2011/0076815 A1 | 3/2011 | Bhalla et al. |
| 2011/0095361 A1 | 4/2011 | Chang et al. |
| 2011/0101446 A1 | 5/2011 | Guan et al. |
| 2013/0299849 A1* | 11/2013 | Tega ............... H01L 29/1095 257/77 |
| 2014/0008664 A1 | 1/2014 | Kudou |
| 2014/0363931 A1* | 12/2014 | Zhang ............ H01L 29/66333 438/135 |
| 2017/0012119 A1* | 1/2017 | Konstantinov ....... H01L 21/047 |
| 2019/0386129 A1 | 12/2019 | Lee et al. |
| 2020/0259012 A1* | 8/2020 | Pala ................ H01L 29/0886 |

OTHER PUBLICATIONS

Woongje Sung et al., "A comparative study of channel designs for SiC MOSFETs: accumulation mode channel vs. inversion mode channel", Proceedings of 29th International Symposium on Power Semiconductor Devices and IC's (ISPSD), pp. 375-378 (2017)10.23919/ISPSD.2017.7988996.

* cited by examiner

SIC MOSFET WITH REDUCED CHANNEL LENGTH AND HIGH $V_{th}$

FIELD OF THE DISCLOSURE

This disclosure relates in general to metal-oxide-semiconductor field-effect transistors (MOSFETs), and more specifically to an improved Silicon Carbide MOSFET structure.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. Recently, a trend has developed towards fabricating power devices using silicon carbide (SiC), specifically for high voltage power devices. Silicon carbide exhibits several desirable characteristics compared with silicon including the ability to operate at a high temperature, high power level, and high frequency. Additionally, silicon carbide power devices exhibit low specific on-resistance ($R_{DSon}$) and high thermal conductivity, specifically 500 to 1000 times higher than silicon power devices, making it desirable for use in constructing power devices.

Unfortunately the non-ideal MOS interface in planar SiC devices results in the channel contributing a larger percentage of the device on-resistance. Maintaining the low $R_{DSon}$ in a silicon carbide power device design often means operating the device at a high gate overdrive voltage compared to silicon devices with similar voltage ratings and hence increasing the dielectric electric field and potentially reducing reliability. This factor combined with the fact that the short circuit depends to first order on channel length leads to silicon carbide power devices having inferior short circuit characteristics compared to similar plain silicon devices.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1:
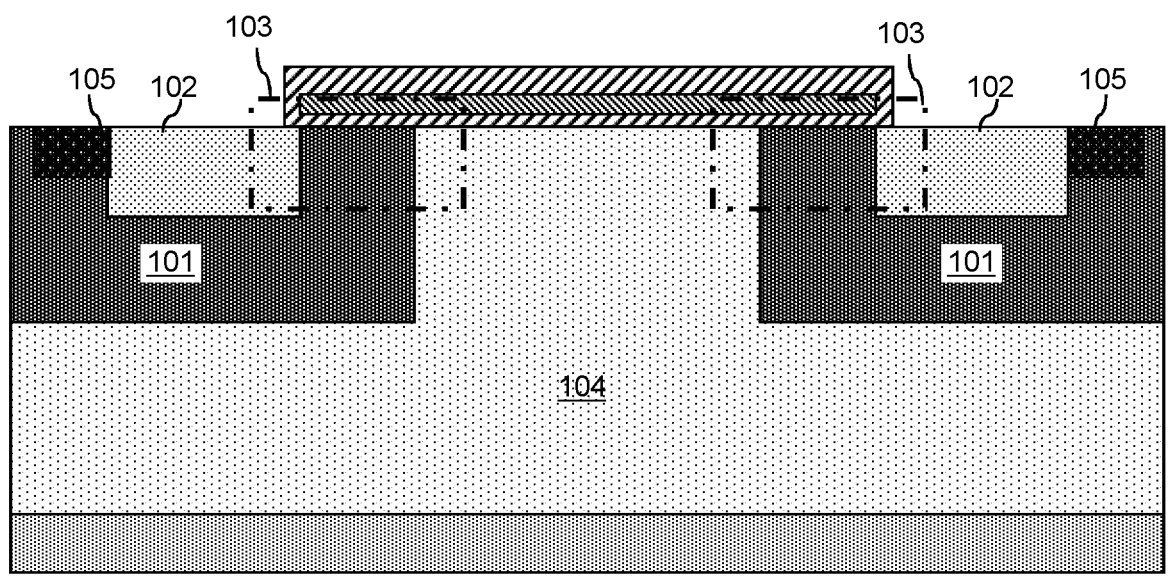
FIG. 1 depicts cross sectional view of a prior art Silicon Carbide MOSFET

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

Improved Silicon Carbide MOSFET devices, according to aspects of the present disclosure, comprise a substrate heavily doped with a first conductivity type, an epitaxial layer lightly doped with the first conductivity type, and a body region doped with a second conductivity type formed in epitaxial layer wherein the second conductivity type is opposite the first conductivity type. The improved Silicon Carbide MOSFET device also includes an accumulation mode region doped with the first conductivity type formed in the body region and an inversion mode region of the second conductivity type formed in the body region, wherein the accumulation mode region is located between the epitaxial layer and the inversion mode region. In some implementations, a width of the inversion mode region is substantially the same as a width of the accumulation mode region. The improved silicon carbide MOSFET may further comprise a source region heavily doped with the first conductivity type formed in at least the body region. A gate may be formed on the surface of the epitaxial layer wherein a portion of the gate is located over the inversion mode region and the accumulation mode region. The improved Silicon Carbide MOSFET may be made by a method comprising, forming an epitaxial layer lightly doped with a first conductivity type on a substrate heavily doped with the first conductivity type and forming a body region mask on the surface of the epitaxial layer. A body region of a second conductivity is formed in the epitaxial layer wherein the second conductivity type is opposite the first conductivity type and an accumulation mode implant region doped with the first conductivity type is formed in the body region. A spacer is created on the surface of the body region at a side of the body region mask; and forming an inversion mode region of the second conductivity type is formed in the accumulation mode implant region over the body region whereby formation of the inversion mode region creates the accumulation mode region.

To appreciate the advantages of Silicon Carbide MOSFETs in accordance with aspects of the present disclosure it is useful to understand the construction of prior art Silicon Carbide MOSFETs. FIG. 1 depicts a prior art Silicon Carbide MOSFET. As shown the prior art Silicon Carbide MOSFET includes a channel 103 that extends from the source region 102 through the body region 101 to the epitaxial layer 104. The MOSFET may include a body contact 105, which is doped with the same conductivity type dopants as the body 101 but with a higher dopant concentration. For example, in an N-type MOSFET, the body would be p-type doped and the body contact would be doped p+. In this prior art channel 103 the main mode of conductance is through a long inversion channel. The body region 101 is the main contributor to the prior art channel 103. The result of the long inversion channel created by the body region 101 is a high specific on resistance ($R_{on, sp}$) for the device. Prior methods have tried to reduce the $R_{on, sp}$ by simply creating a shorter channel through body region, this results in many detrimental short channel effects such as Drain induced Barrier Lower (DIBL), high drain leakage and poor short circuit performance due to the resulting high saturation current.

Silicon Carbide MOSFET Device

Figure 2:
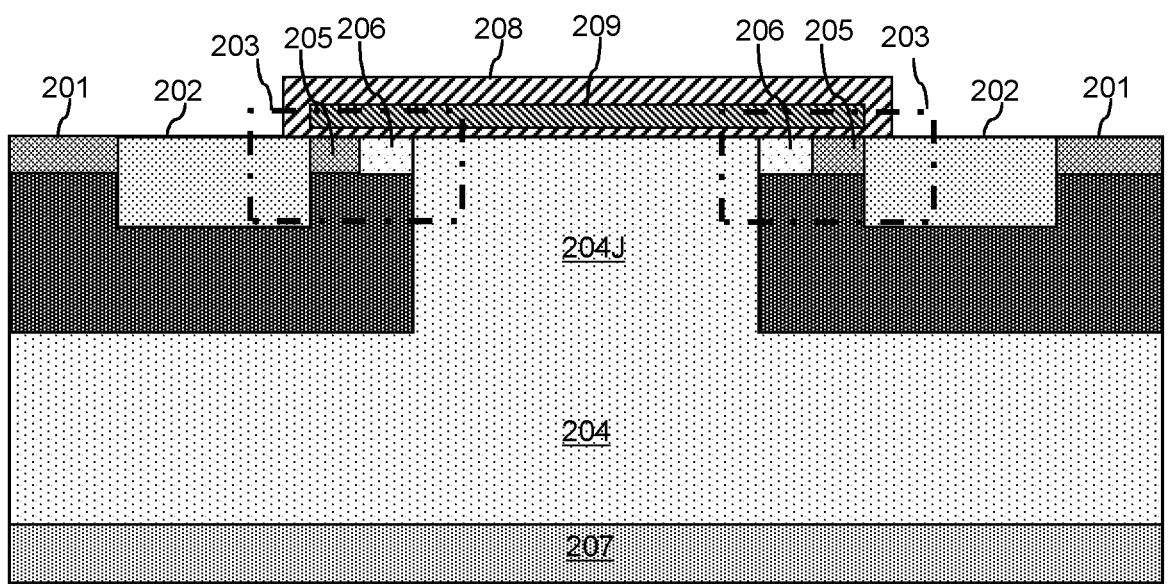
FIG. 2 shows a cross sectional view an improved Silicon Carbide MOSFET according to aspects of the present disclosure.

FIG. 2 shows an improved Silicon Carbide MOSFET according to aspects of the present disclosure. The improved Silicon Carbide MOSFET reduces the $R_{on, sp}$ while maintaining good channel electrostatic integrity. This improvement effectively reduces the inversion mode channel length and increases the threshold voltage (Vth), to achieve better channel electrostatic integrity and lower $R_{on, sp}$ compared to the prior art Silicon Carbide MOSFET devices. In the improved Silicon Carbide MOSFET, the channel 203 includes an inversion mode region 205 that has a reduced length and an accumulation mode region 206 created in the body region 201. A source region 202 is also formed in at least the body region 201. During fabrication the source region 202 may be also be formed in an inversion mode implant region and creation of the source region 202 may determine the final shape of the inversion mode region 205. As shown, the inversion mode region 205 is located between source region 202 and the accumulation mode region 206 on plane with the surface of the epitaxial layer. In some implementations a width of the inversion mode region 205 may be substantially the same as a width of the accumulation mode region 206 as depicted in FIG. 2. However, other configurations are within the scope of the present disclosure. The accumulation mode region 206 is located between the inversion region 205 and a portion of the epitaxial layer 204 that forms a JFET region 204J that extends to the surface of the epitaxial layer.

The Improved Silicon MOSFET device may include other MOSFET structures such as gates, and contacts. The gate is comprised of a gate insulator layer 208 and a gate conductor layer 209. The gate insulator layer 208 is formed on the surface of at least the epitaxial layer 204. The gate may also sit on the surface of the device over the inversion mode region 205 and the accumulation mode region 206 formed in the body region 201 and in the channel 203. A silicon carbide substrate 207 doped with a first conductivity type for example N-type dopants may have the epitaxial layer 204 formed on its surface. The epitaxial layer may be lightly doped with dopants of the first conductivity type. A body region 201 of the second conductivity, e.g P-type dopants, may be formed in the epitaxial layer 204. The Source region 202 may be formed in at least the body region 201 and may be doped with the first conductivity type. The source region 202 dopant concentration is greater than the inversion mode region 205 dopant concentration and the inversion mode region 205 dopant concentration is greater that the epitaxial layer 204 dopant concentration. The epitaxial layer 204 dopant concentration is greater than the accumulation mode region dopant concentration 206. The dopant concentration of one or more of the regions in the channel 203 may be chosen so that the accumulation mode region 206 is fully depleted of conductors in the 'Off' state creating a barrier to electric fields or leakage currents.

Method of Making

Figure 3:
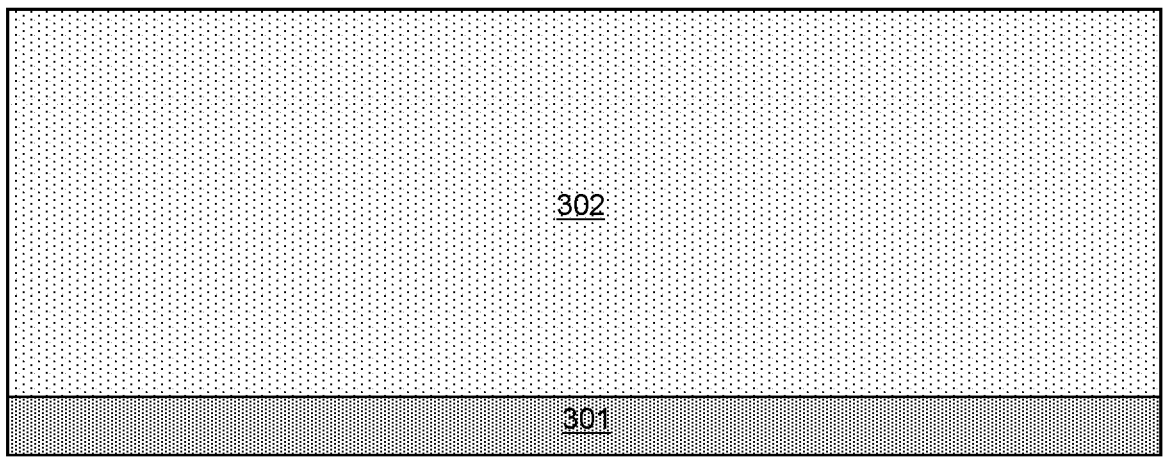
FIG. 3 depicts a cross sectional view of a heavily doped substrate of the first conductivity type with a lightly doped epitaxial layer of the first conductivity type formed on its surface in the method of making the improved Silicon Carbide MOSFET according to aspects of the present disclosure.

FIGS. 3 through 13 depict the method of making the improved Silicon Carbide MOSFET according to aspects of the present disclosure. FIG. 3 depicts a heavily doped substrate 301 of the first conductivity type with a lightly doped epitaxial layer 302 of the first conductivity type formed on its surface. The epitaxial layer 302 (sometimes called a drift layer) may be grown on the surface of the substrate by epitaxy or other similar process. The first conductivity type may be opposite a second conductivity for example if the first conductivity type is n-type, the second conductivity type is p-type. N-type dopants include phosphorus, arsenic and any other material that provides a free charge carrier when impregnated into silicon carbide. P-type dopants include beryllium, boron, aluminum, gallium and any other material that provides as a hole for charge carriers when impregnated into silicon carbide. The dopant concentration in the epitaxial layer may be $1\times10^{15}$ cm$^{-3}$ to $5\times10^{17}$ cm$^{-3}$.

In some implementations there may be an epitaxially grown buffer layer between the substrate 301 and the epitaxial layer 302. The doping level of such a buffer layer is in between that of the substrate and that of the epitaxial layer. Such a layer may be grown during the process that forms the epitaxial layer. In such implementations, the buffer layer may be regarded as part of the epitaxial layer.

Figure 4:
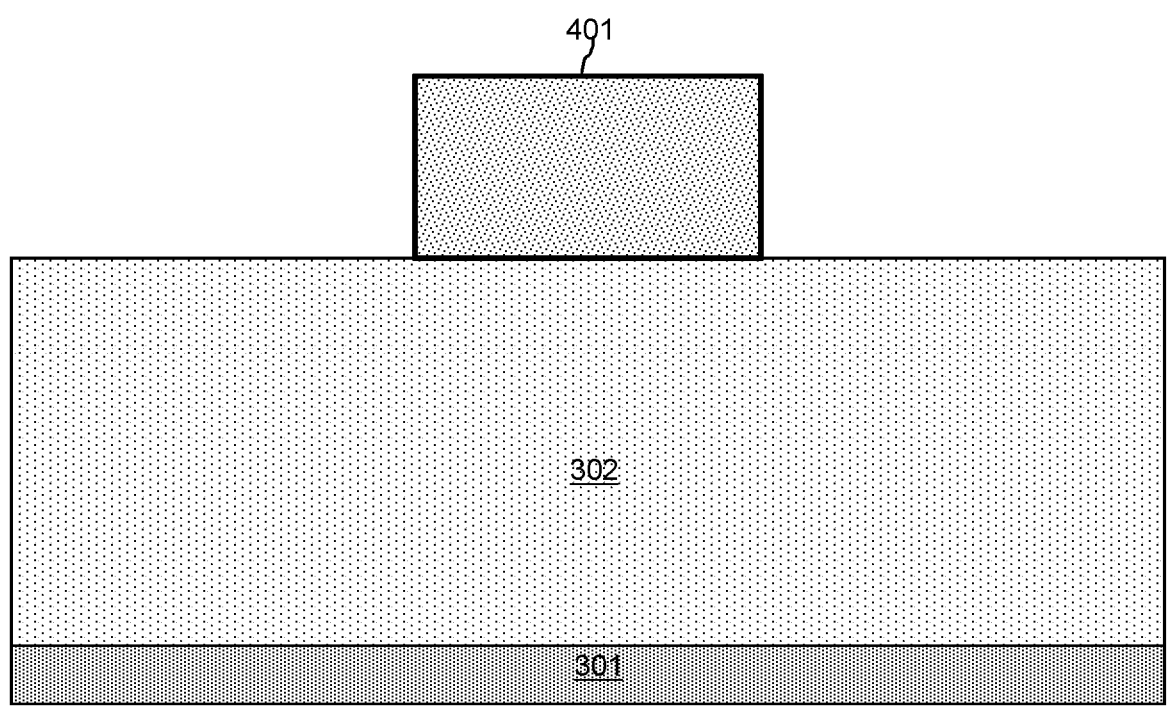
FIG. 4 depicts a cross sectional view of the silicon carbide substrate, epitaxial layer, and formation of the body region mask in the method of making the Silicon Carbide MOSFET according to aspects of the present disclosure.

FIG. 4 depicts a cross sectional view of the silicon carbide substrate 301, epitaxial layer 302, and formation of the body region mask 401 according to aspects of the present disclosure. After formation of the epitaxial layer 302 on the surface of the substrate 301, a body mask 401 is formed on the surface of the epitaxial layer 301. The body mask 401 may be any type if mask for example, a phenol, epoxy or acrylic resin, that is a photo-resist mask or a hard mask, such as a patterned oxide or polysilicon layer. The thickness of the body mask is sufficient to prevent ion implantation in an area underneath the body mask.

Figure 5:
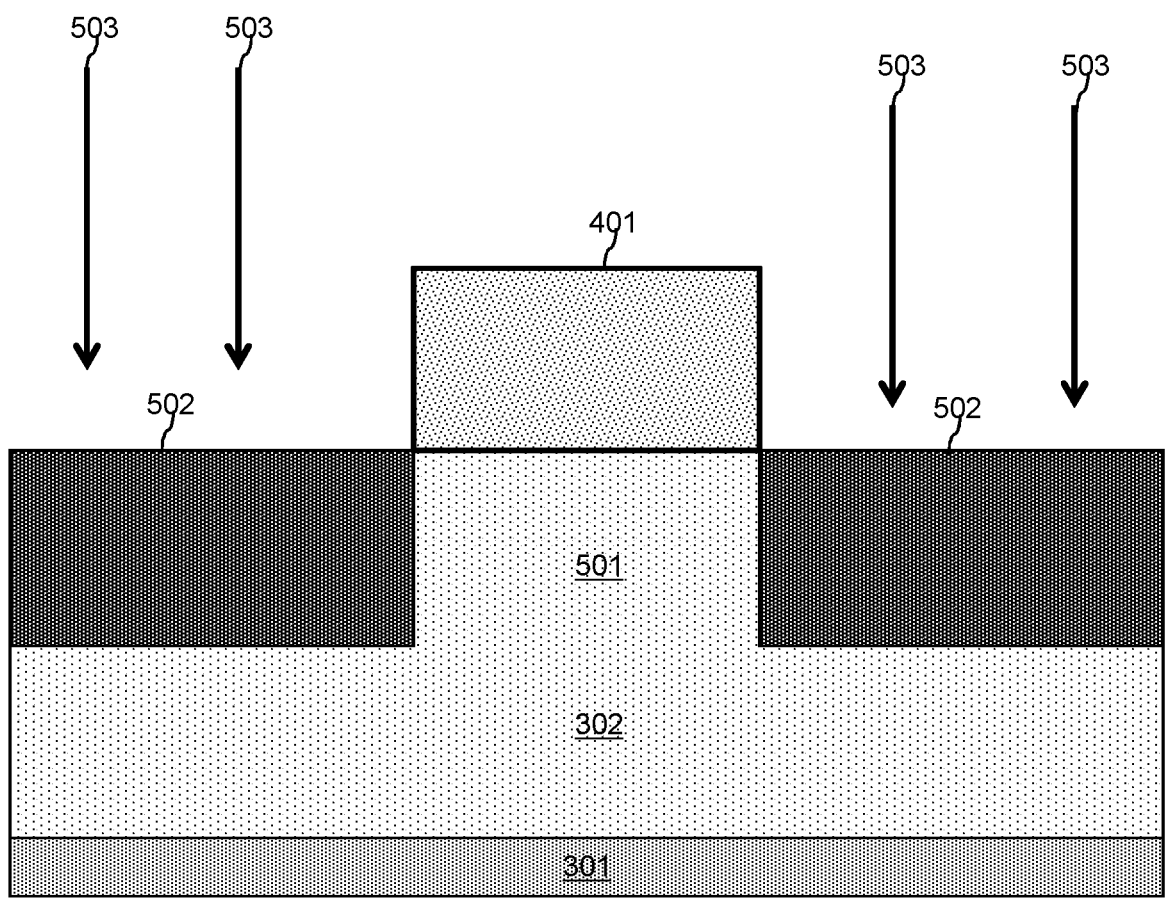
FIG. 5 shows a cross sectional view of the silicon carbide substrate, silicon carbide epitaxial layer, body region mask and formation of body regions in the epitaxial layer in the method of making the Silicon Carbide MOSFET according to aspects of the present disclosure.

FIG. 5 shows a cross sectional view of the silicon carbide substrate 301, silicon carbide epitaxial layer 302, body region mask 401 and formation of body regions 502 in the epitaxial layer according to aspects of the present disclosure. After creation of the body region mask 401, the body regions 502 (also referred to as well regions) may be formed in the epitaxial layer via implantation of ions 503 into selected portions of the epitaxial layer 302. Blanket-doped layers, such as the epitaxial layer 302 may be doped during the epitaxial growth process that forms the layer. The implantation of the ions 503 may dope selected portions of the epitaxial layer 302 with dopants of the second conductivity type e.g., P-type dopants if the epitaxial layer is doped with N-type dopants. The energy of implantation for the ions 503 may be between 250 Kiloelectron Volt (keV) and 1 Megaelectron volt (MeV) with dopant concentrations of around $1\times10^{17}$ cm$^{-3}$. The dopant concentration may be non-uniform in one or more dimensions. For example, body dose is usually retrograde with heavier dose (e.g., $1\times10^{19}$ cm$^{-3}$) at the bottom to $1\times10^{17}$ cm$^{-3}$ at the surface. The body region mask 401 prevents implantation of dopants of the second conductivity type in the JFET region 501 of the epitaxial layer 302 which lies underneath the gate in the finished device.

Figure 6:
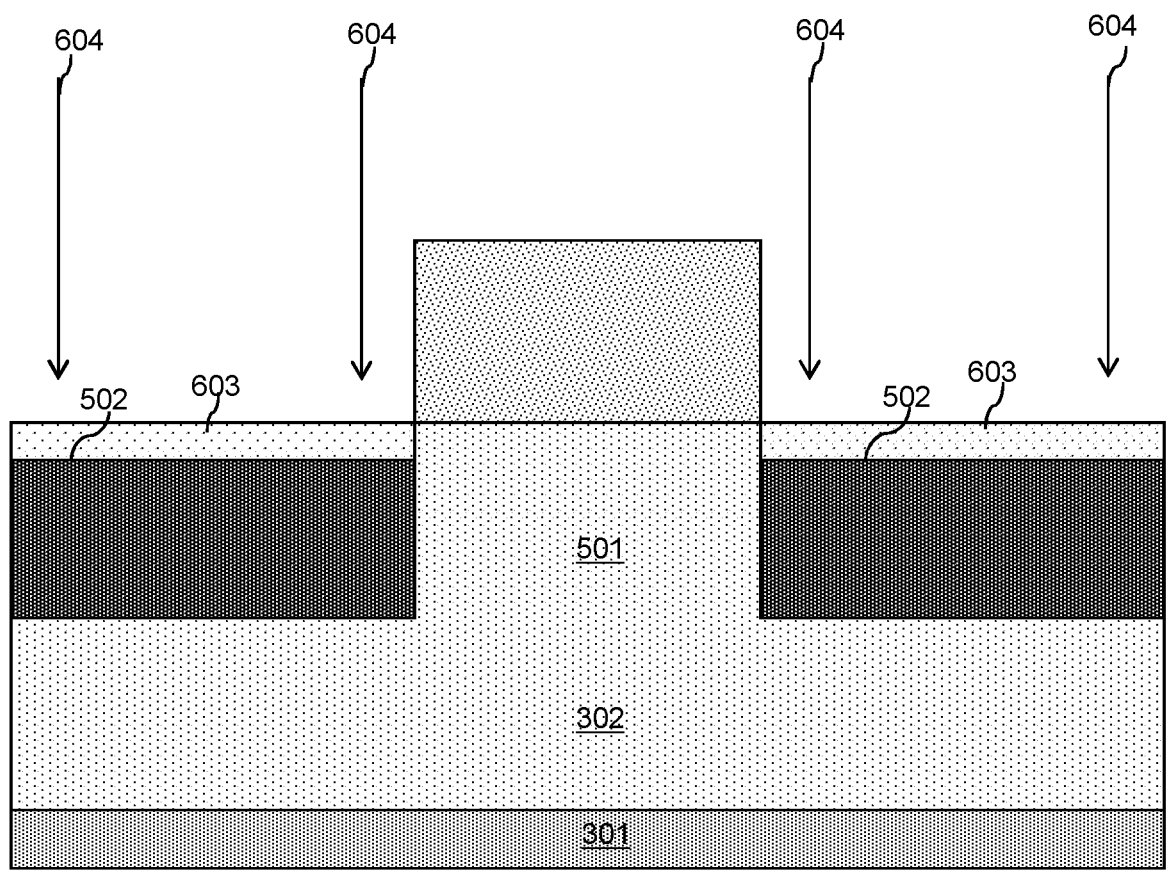
FIG. 6 depicts a cross sectional view of the silicon carbide substrate, silicon carbide epitaxial layer, body region and formation of the accumulation mode implant region in the method of making the Silicon Carbide MOSFET according to aspects of the present disclosure.

FIG. 6 depicts a cross sectional view of the silicon carbide substrate 301, silicon carbide epitaxial layer 302, JFET region 501, body regions 502 and formation of the accumulation mode implant region 603 according to aspects of the present disclosure. After implantation to form the body regions 502, the accumulation mode implant region 603 is formed in the body region via implantation of ions 604 that correspond to dopants of the first conductivity type. The accumulation mode implant region 603 may be doped using a lower ion implantation energy than the body regions 502. By way of example and without limitation, the ions 604 may be implanted at an energy of 10 keV to 50 keV. The lower energy of implantation results in a shallow depth of implantation into the body region. The concentration of dopants in the accumulation mode implant region 603 may be between $5\times10^{15}$ cm$^{-3}$ and $1\times10^{17}$ cm$^{-3}$. The result of implantation of the body region is a shallow accumulation mode implant region 603 of the first conductivity type over the deeper body region 602 of the second conductivity.

Figure 7:
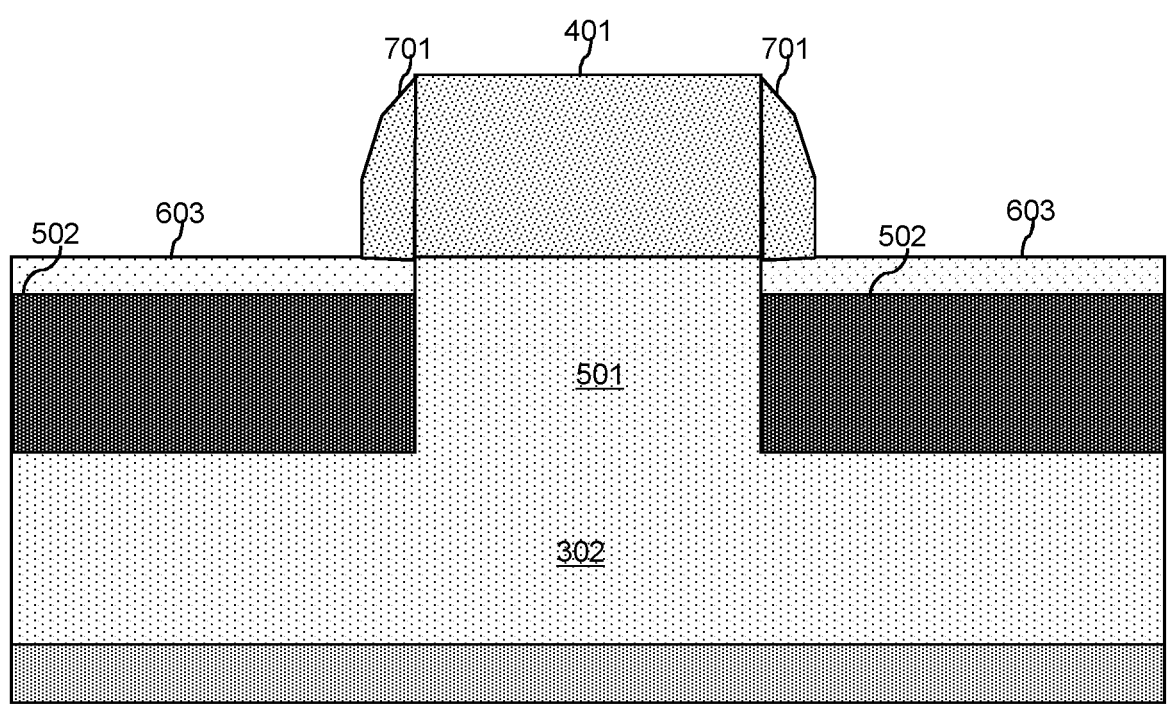
FIG. 7 shows a cross sectional view of the silicon carbide substrate silicon carbide epitaxial layer, body region, and creation of a spacer on the surface of the epitaxial layer in the method of making the Silicon Carbide MOSFET according to aspects of the present disclosure.

FIG. 7 shows a cross sectional view of the silicon carbide substrate 301, silicon carbide epitaxial layer 302, body region 502 and creation of an accumulation spacer 701 on the surface of the epitaxial layer according to aspects of the present disclosure. Following formation of the accumulation mode region, the accumulation spacer 701 may be formed on the surface of the epitaxial layer 302 at a side of the body region mask 401. The accumulation spacer 701 may be an oxide layer grown on the side of the body mask 401. Alternatively, the accumulation spacer may be formed by deposition of material, e.g., followed by etch back leaving a masked portion that is wider than the portion masked by the body region mask 401. The accumulation spacer may be 0.1 microns to 0.5 microns wide from the side of the body mask. The width of the accumulation spacer 701 determines the final width of the accumulation mode region. The thickness of the accumulation spacer 701 is chosen to be sufficient to stop ion implantation in the accumulation mode implant region 603 of the epitaxial layer underneath the spacer.

Figure 8:
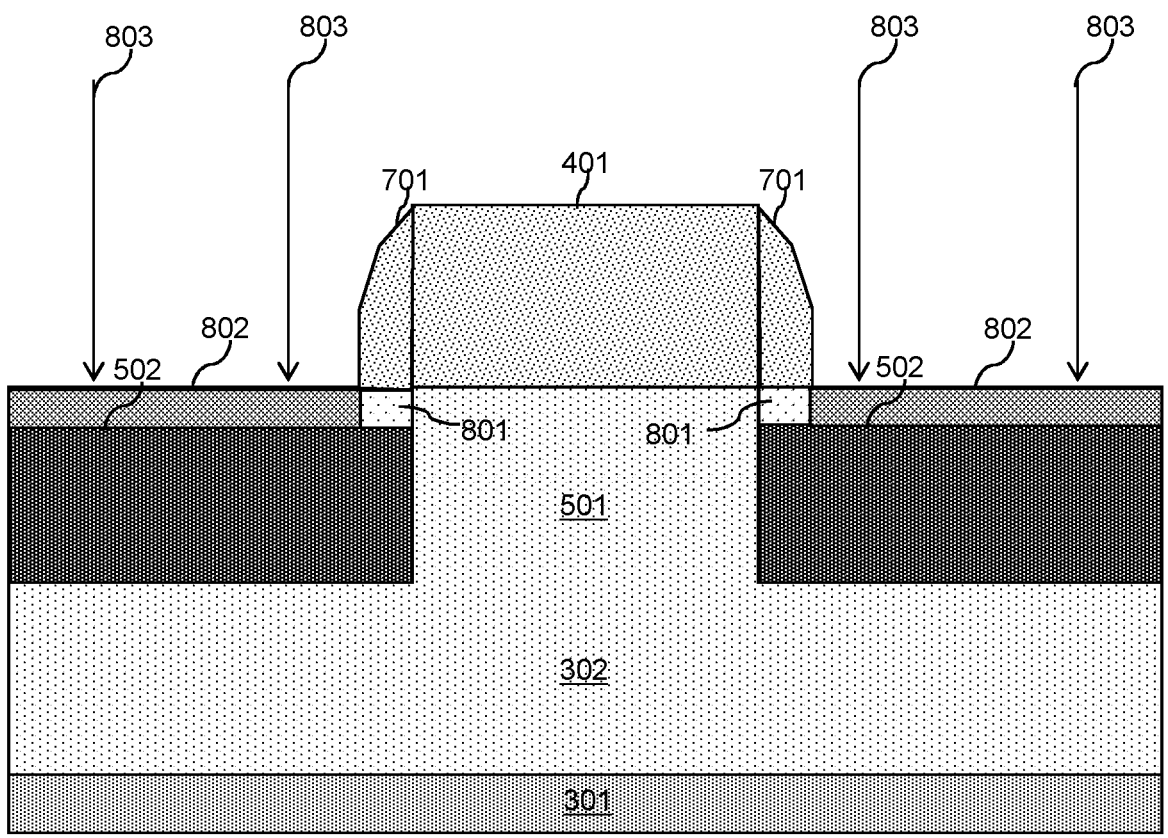
FIG. 8 depicts a cross sectional view of the silicon carbide substrate, silicon carbide epitaxial layer, body region, accumulation region spacer, body mask and formation of the inversion mode implant region and accumulation mode region in the method of making the Silicon Carbide MOSFET according to aspects of the present disclosure.

FIG. 8 depicts a cross sectional view of the silicon carbide substrate 301, silicon carbide epitaxial layer 302, JFET region 501, body region 502, accumulation region spacer 701, body mask 401 and formation of the inversion mode implant region 802 and accumulation mode region 801 according to aspects of the present disclosure. After creation of the accumulation spacer 701, the inversion mode implant region 802 is formed via implantation of ions 803 into selected portions of the accumulation mode implant region 603. Blanket-doped layers, such as the epitaxial layer 302 may be doped during the epitaxial growth process that forms the layer. The ions 803 correspond to dopants of the second conductivity type e.g., P-type dopants if the epitaxial layer 301 is doped with N-type dopants. The formation of the inversion mode implant region 802 creates the final dimensions of the accumulation mode region 801 by counter-doping portions of the accumulation mode implant region 603. The accumulation region spacer prevents ion implantation 803 in the accumulation mode region 801 while allowing implantation in uncovered areas of the accumulation mode implant region 603. The depth of the accumulation mode region 801 remains the same as the depth of the accumulation mode implant region 603 only the size of the accumulation mode region 801 is changed. The energy of implantation of the ions 803 for the inversion mode implant region is 10 keV to 50 keV, thus the inversion mode implant region 802 is created at approximately the same depth as the accumulation implant region. The concentration of dopants implanted is $5\times10^{16}$ to $1\times10^{18}$. In some implementations, the inversion mode implant region 802 may be created at the same depth as the accumulation implant region and converts the area of the accumulation implant region not under the accumulation region spacer 701 into the inversion implant region 802. For example, the same energy of implantation may be used for both inversion mode implant and accumulation mode implant with some adjustment for the type of dopant used of each region. Alternatively, the energy of implantation of the inversion region may be slightly higher than that of the accumulation implant region thus leading to a deeper implant of the inversion region and ensuring that the accumulation implant region 603, which is not covered by the accumulation region spacer, is completely converted to inversion mode implant region 802.

Figure 9:
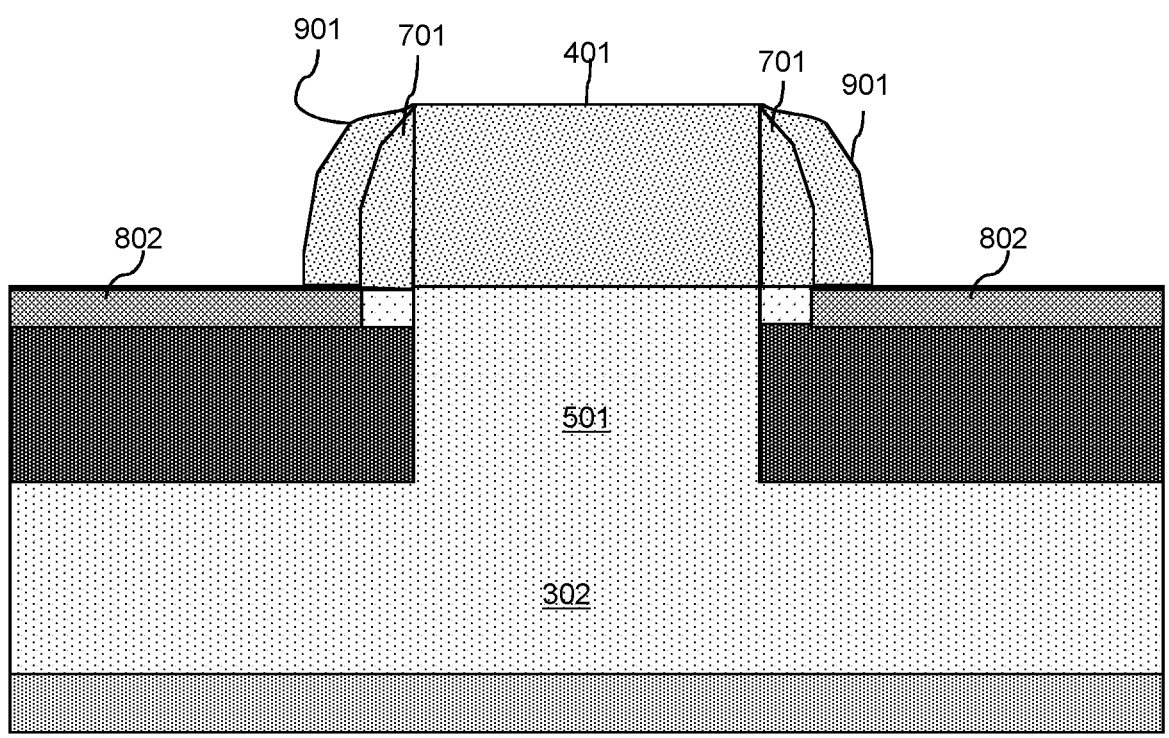
FIG. 9 shows a cross sectional view of the formation inversion region spacer over the inversion region in the method of making the Silicon Carbide MOSFET according to aspects of the present disclosure

FIG. 9 shows a cross sectional view of the formation inversion region spacer 901 over the inversion mode implant region 802 according to aspects of the present disclosure. Following creation of the inversion mode implant region 802, the inversion region spacer 901 may be deposited on the surface of the epitaxial layer at a side of the accumulation mode spacer 701 and over a portion the inversion mode implant region 802 that will become the inversion mode region. Similar to the accumulation mode spacer, the inversion region spacer may be an oxide deposited on the surface of the epitaxial layer. In alternative implementations, the spacer 901 may be polysilicon or even photoresist. Alternatively, the inversion region spacer 901 may be formed by deposition of material, e.g., followed by etch back leaving a masked portion that is wider than the portion masked by the body region mask 401 and accumulation region spacer 701. The width of the inversion region spacer 901 may be 0.1 microns to 0.5 microns. The width of the of the inversion region spacer 901 determines the final width of the inversion mode region. The inversion region spacer may be deposited on the epitaxial layer over the inversion mode implant region 802 by for example and without limitation, thermal oxide deposition, chemical vapor deposition (CVD), physical vapor deposition (PVD) or the like.

Figure 10:
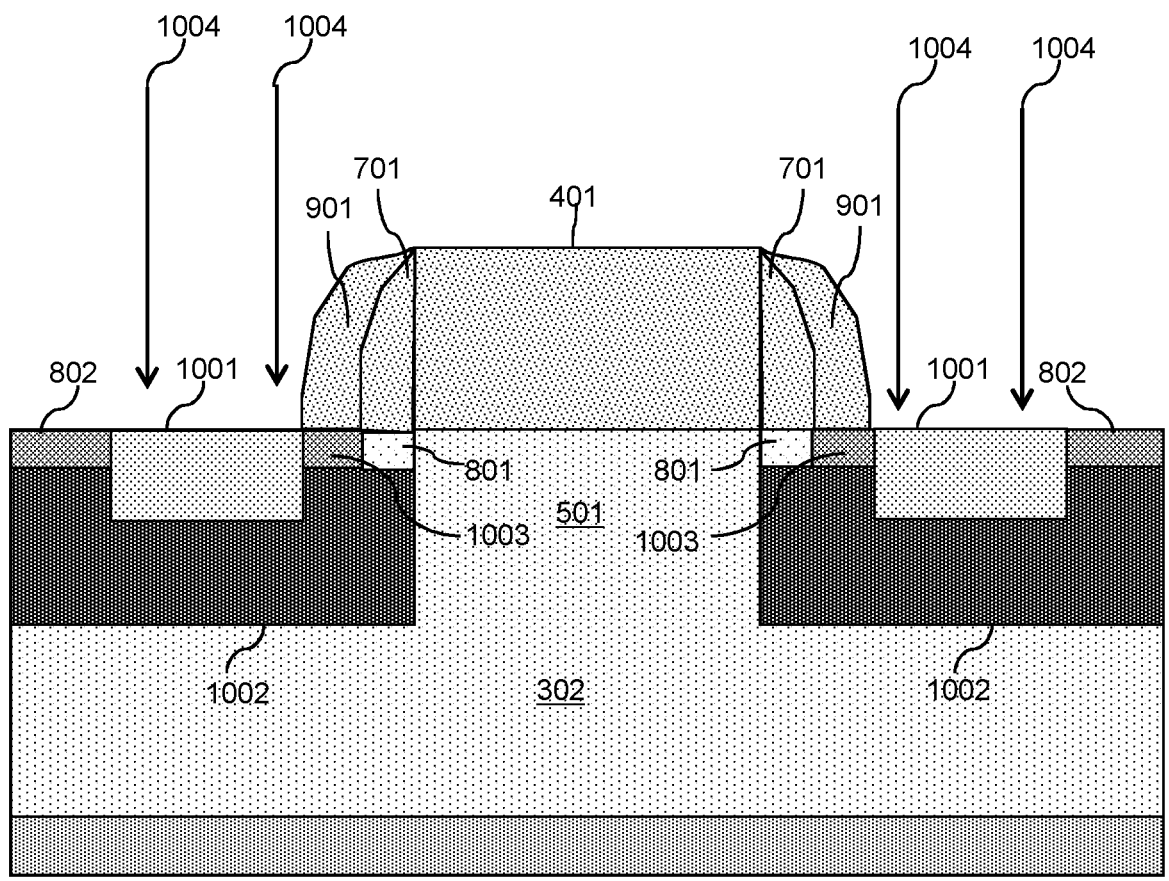
FIG. 10 depicts a cross sectional view of the formation of the source region in the body region and inversion implant region in the method of making the Silicon Carbide MOSFET according to aspects of the present disclosure.

FIG. 10 depicts a cross sectional view of the formation of the source region 1001 in the body region 1002 and inversion mode implant region 802 in the method of making the Silicon Carbide MOSFET according to aspects of the present disclosure. After the inversion mode spacer 901 is created the source region 1001 heavily doped with the first conductivity type may be formed through an opening in the spacers. Formation of the source region 1001 creates the dimensions of the inversion region 1003. The source region 1001 may be created using ion implantation or any other method for impregnating a silicon carbide epitaxial layer with dopants. By way of example, and not by way of limitation, the source region 1001 may be implanted with ions 1004 corresponding to dopants of the first conductivity type. The concentration of dopants in the source region may be from $1\times10^{19}$ cm$^{-3}$ to $1\times10^{21}$ cm$^{-3}$ and the energy of implantation may be from 10 keV to 200 keV. In some embodiments, the source region 1001 may have an implant depth that is deeper than the accumulation region 801 or inversion region 1003. During implantation, the inversion spacer 901 blocks implantation over a portion of the inversion implant region creating the size of the inversion mode region 1003. Similarly, the accumulation spacer 701 and body mask 401 block implantation of the epitaxial layer in their respective positions ensuring that dimensions and doping concentrations in the accumulation region 801 and the JFET region 501 of the epitaxial layer 302 are maintained. If the source region 1001 is implanted without a mask it could counter the doping that would otherwise be present in the inversion mode implant region 802. In such implementations, the inversion mode implant region 802 on the edges of the device may be formed by a subsequent implant with suitable dopants and a separate mask to make a body contact region 802.

Figure 11:
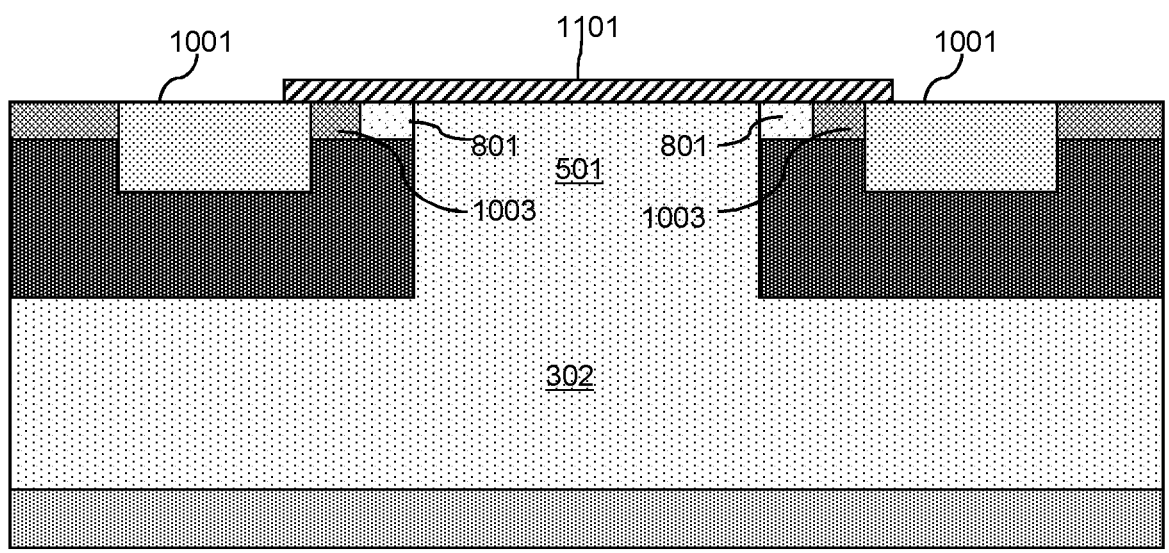
FIG. 11 shows a cross sectional view of the formation of the Gate insulating layer in the method of making the Silicon Carbide MOSFET according to aspects of the present disclosure.

FIG. 11 shows a cross sectional view of the formation of the Gate insulating layer 1101 in the method for making the Silicon Carbide MOSFET device according to aspects of the present disclosure. After the source region 1001 is formed, the body mask, accumulation spacer and inversion spacer are removed using etching and polishing to reveal the epitaxial layer 601. The gate insulating layer 1101 is formed. The gate insulating layer 1101 may be an insulator such as silicon dioxide, hafnium oxide, titanium oxide, etc. deposited on the surface of the epitaxial layer 601. The thickness of the gate insulation layer 1101 may be 100-1200 angstroms (Å). The gate insulating layer 1101 may be formed by any known method such as thermal oxide deposition, CVD, or PVD. The gate insulating layer 1101 may cover a portion of the surface of the epitaxial layer 302 over the inversion mode region 1003, accumulation region 801 and JFET region 1102. The gate insulating layer 1101 may also cover a portion of the surface of the source region 1001.

Figure 12:
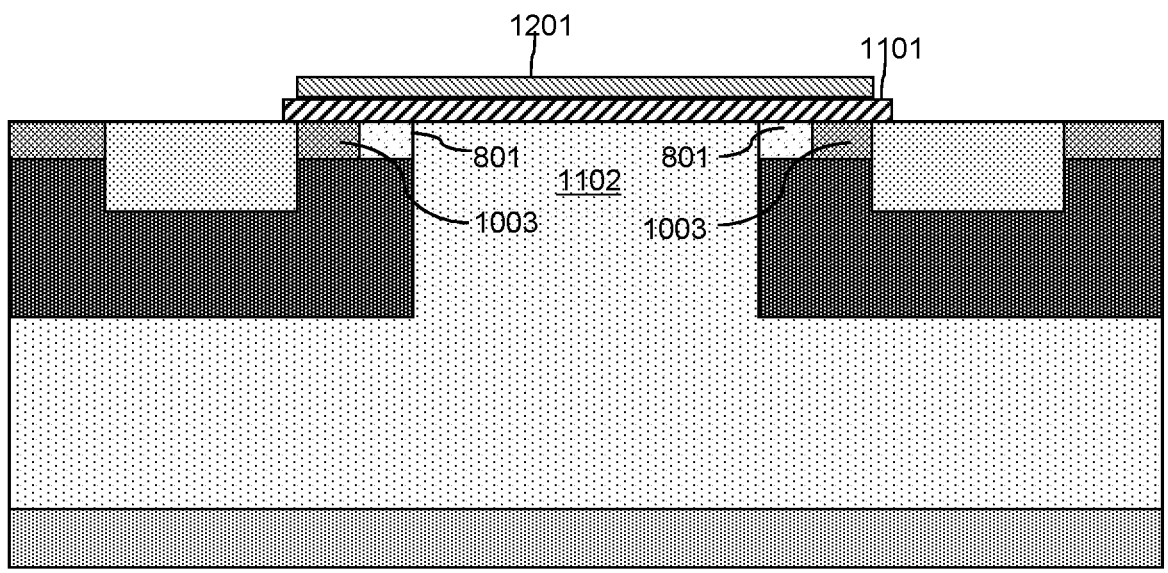
FIG. 12 depicts a cross sectional view of the formation of the gate conductor layer in the method of making the Silicon Carbide MOSFET according to aspects of the present disclosure.
Figure 13:
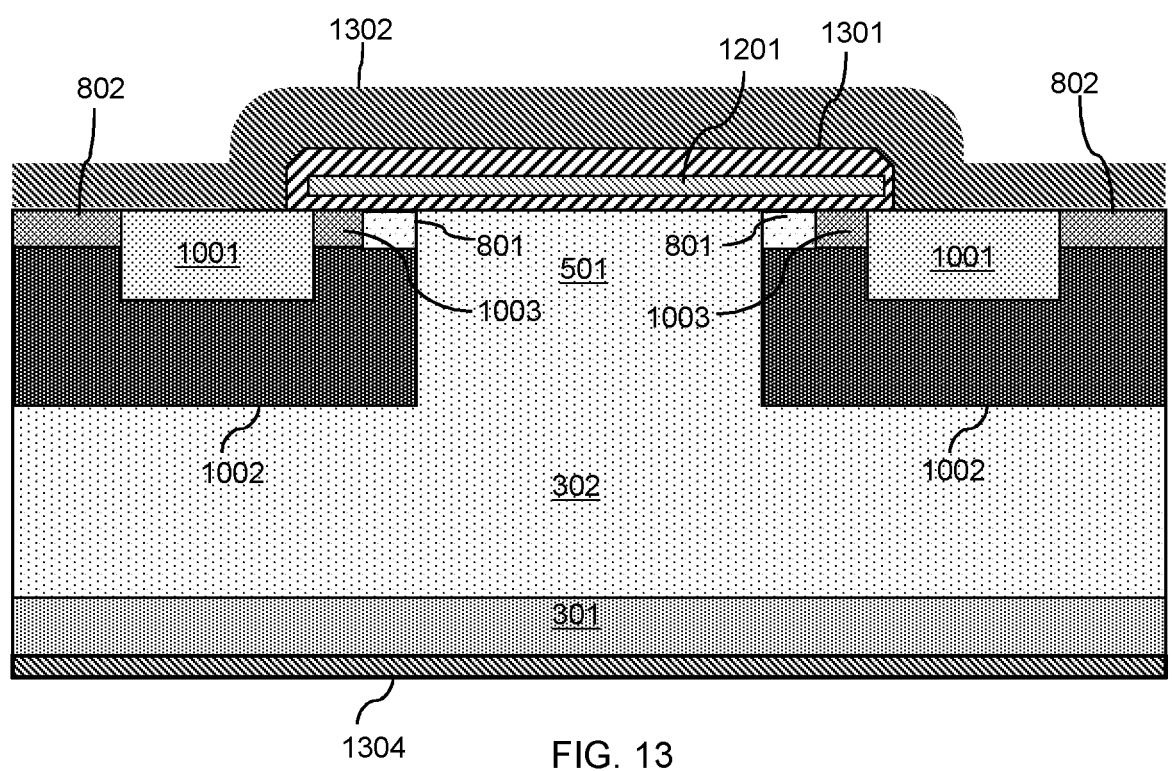
FIG. 13 depicts a cross section of the formation of other MOSFET structures on the surface of the epitaxial layer and substrate in the method of making the Silicon Carbide MOSFET according to aspects of the present disclosure.

FIG. 12 depicts a cross sectional view of the silicon carbide MOSFET Device during formation of the gate conductor layer 1201 according to aspects of the present disclosure. Following creation of the gate insulating layer 1101, the gate conductor layer 1201 may be formed on the top surface of the insulating layer 1101. The gate conductor may be a metal or polycrystalline silicon and may be 1000-6000 angstroms thick. The gate conductor layer 1201 may be deposited or grown on the surface of the gate insulator 1101. A photo-resist or a mechanically applied mask and etching process such as plasma dry etch may be used to create the gate conductor layer over the gate insulator layer 1101. The gate conductor layer 1201 may be formed over the JFET region 501, accumulation mode region 801 and inversion mode region 1003 of the epitaxial layer. The gate conductor layer 1201 location may be configured such that when a voltage is applied to gate conductor current flows from the source region through at least the inversion mode region 1003, accumulation mode region 801, and JFET region 1102 to a drain metal located on the opposite side of the substrate. FIG. 13 depicts a cross sectional of the silicon carbide MOSFET device in the formation of other MOSFET structures on the surface of the epitaxial layer 302 and substrate 301 according to aspects of the present disclosure. Finally, after the gate conductor layer 1201, the source region 1001, the inversion mode regions 1003, accumulation mode regions 801 and body regions 1002 have been formed in the epitaxial layer the other MOSFET structures may be formed. The other MOSFET structures include source contacts 1302, gate contacts 1303, a drain metal 1304 and an isolation layer 1301. Formation of source contacts 1302 in corresponding source connection holes and gate contacts 1303 in corresponding gate connection holes is shown in FIG. 13. An isolation layer 1301 is deposited on top of the wafer surface after gate formation. By way of example, and not by way of limitation, the isolation layer may be made of an oxide, a nitride, a silicate-glass material or some combination of two or more of these. Deposition of the isolation layer 1301 fully insulates the gate conductor layer 1201 creating the complete gate 1305 structure. Thus, the gate 1305 structure includes at least the gate insulating layer and gate conductor layer 1201, it may also include additional insulation that that surrounds the gate conductor layer 1201. Then a patterned contact mask is that forms holes in the isolation layer 1301 for source, poly and termination connections. The contact holes may be etched in the isolation layer by plasma dry etching through corresponding openings in the contact mask. After dry etching, the contact mask may be removed by plasma ashing and washing with a removal solution or by any other known mask removal technique for example and without limitation planarization or polishing. Source and gate contacts may be formed by a layer of conductive material 1302, such as a layer of metal. By way of example, and not by way of limitation, the conductive material may include a barrier layer of, Ti/TiN, and an ohmic metal layer, such as a layer of Nickel (Ni) covered by an overmetal layer, such as a layer of Aluminum (Al). The gate conductor layer 1201 and the conductive material 1302 layer may be patterned so that contact to the gate may be formed through the isolation layer 1301 in a way that maintains electrical isolation between the source and the gate. In some implementations, the contact to the gate conductor may be made in the third dimension, i.e., out of the plane of the cross-section shown in FIG. 13.

Doping Characteristics

Figure 14:
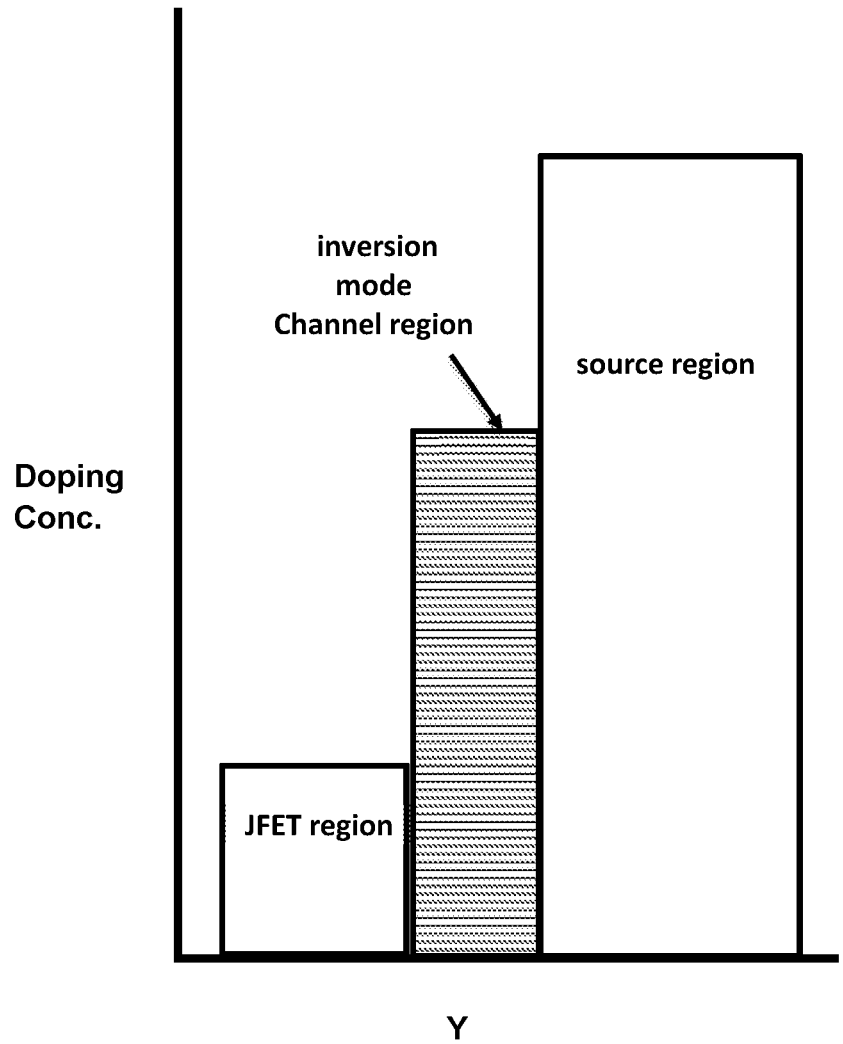
FIG. 14 is a bar graph depicting the prior art dopant concentration along a Y-axis on the surface of the epitaxial layer of a prior art silicon carbide MOSFET device.

Further distinctions between conventional Silicon Carbide MOSFET devices and devices in accordance with aspects of the present disclosure may be understood in terms of the dopant profiles. The bar graph shown in FIG. 14 illustrates a dopant concentration profile along a at the surface of the epitaxial layer of a prior art silicon carbide MOSFET device along a cross-section like that shown in FIG. 1. The graph uses different shading to indicate different conductivity types. As shown, the dopant concentration for the prior art device is highest in the source region 102, lesser in the body/inversion region 101 and lowest in the JFET region of the epitaxial layer 104. In the prior art device, carrier movement occurred only through inversion mode conductance and thus suffered from high $R_{on, sp}$.

Figure 15:
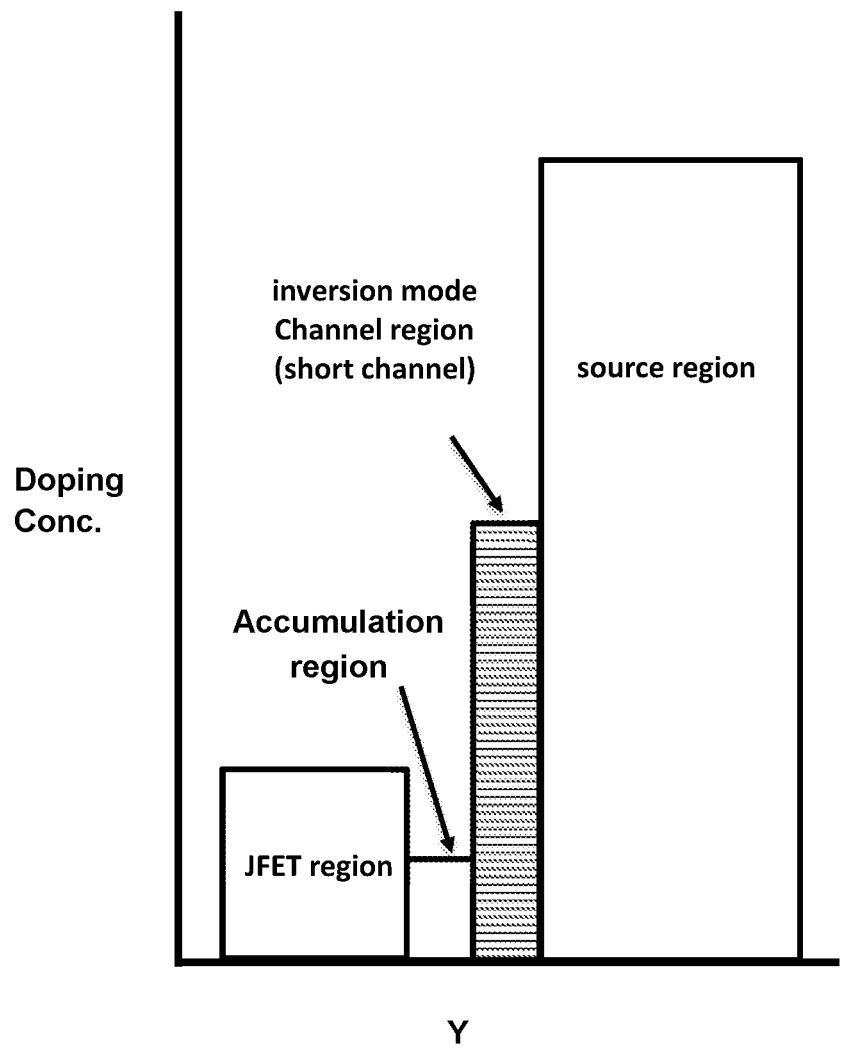
FIG. 15 is a bar graph depicting the dopant concentration along a Y-axis on the surface of the epitaxial layer of the improved silicon carbide MOSFET device according to aspects of the present disclosure.

The bar graph in FIG. 15, by contrast depicts a dopant concentration profile for an improved silicon carbide MOSFET device according to aspects of the present disclosure. As in FIG. 14, the graph uses different shading to indicate different conductivity types. The illustrated concentration profile is taken at the surface of a device like that shown in FIG. 2 along the cross-section shown therein. The doping concentration in the source region 202 is the highest. The region with the second highest doping concentration is the inversion mode region 205 and the region with the third highest doping concentration is the JFET region 204J. The accumulation region 206 has the lowest doping concentration and is configured to fully deplete of carriers during operation. Thus, the improved silicon carbide MOSFET device operates in both inversion mode channels and accumulation mode channels, which improves the $R_{on, sp}$ without the negative effects of simply reducing the channel length.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A silicon carbide MOSFET comprising:
   a substrate heavily doped with a first conductivity type;
   an epitaxial layer lightly doped with the first conductivity type having a junction field effect transistor (JFET) region of the first conductivity type;
   a body region doped with a second conductivity type formed in the epitaxial layer wherein the second conductivity type is opposite the first conductivity type;
   an accumulation mode region doped with the first conductivity type formed in the body region and an inversion mode region of the second conductivity type formed in the body region, wherein the accumulation mode region is located between the JFET region and the inversion mode region; and
   a source region with the first conductivity type doped from a surface of the epitaxial layer to a depth deeper than a bottom of the inversion mode region.

2. The silicon carbide MOSFET of claim 1 wherein the source region is heavily doped with the first conductivity type and is formed in at least the body region.

3. The silicon carbide MOSFET of claim 2 wherein the inversion mode region is between the source region and the accumulation mode region wherein a width of the inversion mode region is substantially the same as a width of the accumulation mode region.

4. The silicon carbide MOSFET of claim 2 further comprising a gate formed on the surface of the epitaxial layer over the JFET region.

5. The silicon carbide MOSFET of claim 4 wherein a portion of the gate is located over the inversion mode region and the accumulation mode region.

6. The silicon carbide MOSFET of claim 1 wherein the doping concentration of the inversion mode region is greater than the doping concentration of the epitaxial region and the doping concentration of the JFET region is greater than the doping concentration of the accumulation mode region.

7. The silicon carbide MOSFET of claim 6 wherein a source region doping concentration is greater than the doping concentration of the inversion mode region.

8. A method for making a silicon carbide MOSFET comprising:
   a) forming an epitaxial layer lightly doped a first conductivity type on a substrate heavily doped with the first conductivity type;
   b) forming a junction field effect transistor (JFET) region and a body region in the epitaxial layer, wherein the JFET region is of the first conductivity type, and wherein the body region is of a second conductivity type, wherein the second conductivity type is opposite the first conductivity type;
   c) forming an accumulation mode implant region doped with the first conductivity type in the body region;
   d) forming an inversion mode region of the second conductivity type in the accumulation mode implant region precursor over the body region, wherein the accumulation mode region is located between the JFET region and the inversion mode region; and
   e) forming a source region with the first conductivity type doped from surface of the epitaxial layer to a depth deeper than a bottom of the inversion mode region.

9. The method of claim 8, wherein a process that forms the inversion mode region also forms the accumulation mode region.

10. The method of claim 8, wherein the source region is heavily doped with the first conductivity type and is formed in at least the body region.

11. The method of claim 10 wherein the inversion mode region is located between the source region and the accumulation mode region.

12. The method of claim 10, further comprising forming a gate on the surface of the epitaxial layer.

13. The method of claim 12, wherein a portion of the gate is located over the inversion mode region and the accumulation mode region.

14. The method of claim 8 wherein a doping concentration of the inversion mode region is greater than the doping concentration of the epitaxial region and the doping concentration of the epitaxial region is greater than the doping concentration of the accumulation mode region.

15. The method of claim 14 wherein a source region doping concentration is greater than the doping concentration of the inversion mode region.

\* \* \* \* \*